(12) United States Patent
Ulrich et al.

(10) Patent No.: US 7,771,574 B2
(45) Date of Patent: Aug. 10, 2010

(54) SPUTTERING CATHODE FOR COATING PROCESSES

(75) Inventors: Jürgen Ulrich, Schöneck (DE); Peter Sauer, Schluchtern (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 667 days.

(21) Appl. No.: 10/889,996

(22) Filed: Jul. 13, 2004

(65) Prior Publication Data

US 2005/0279629 A1 Dec. 22, 2005

(30) Foreign Application Priority Data

Jun. 22, 2004 (EP) ................... 04014534

(51) Int. Cl.
C25B 9/00 (2006.01)
C25B 11/00 (2006.01)
C25B 13/00 (2006.01)
C23C 14/00 (2006.01)

(52) U.S. Cl. .............................. 204/298.09; 204/298.12

(58) Field of Classification Search ............ 204/192.12, 204/298.09, 298.12, 298.19
See application file for complete search history.

(56) References Cited

U.S. PATENT DOCUMENTS 5,069,772 A * 12/1991 Fritsche et al. ......... 204/298.12

(Continued)

FOREIGN PATENT DOCUMENTS

DE 197 55 448 A 6/1999

(Continued)

OTHER PUBLICATIONS http://www.merriam-webster.com/dictionary/diaphragm [Accessed on Jul. 16, 2008].*

(Continued)

Primary Examiner—Alexa D Neckel
Assistant Examiner—Michael Band
(74) Attorney, Agent, or Firm—Fulbright & Jaworski L.L.P.

(57) ABSTRACT

A sputtering cathode (1) for coating processes in a vacuum chamber (18) comprises one at least single-piece target plate (2) mounted on a metallic diaphragm (3). On the side of the diaphragm (3) facing away from the target plate (2) is disposed a cooling agent channel with an inflow line (9) and an outflow line (10) for a cooling agent and a hollow space (7) for at least one magnet system (5). The magnet system (5) is disposed in a supporting tub (6) sealed against the diaphragm (3) and not exposed to the cooling agent. The entire configuration is disposed on a supporting structure (12). In order to improve the heat transfer from the target plate (2) to the cooling agent in simple, efficient and cost-effective manner and to avoid the hazard of the cooling agent penetrating into the vacuum chamber, the invention provides that a) the supporting structure (12) for the sputtering cathode (1) comprises a hollow body (13), which is closed gas-tight against the interior space of the vacuum chamber (18) and which connects the hollow space (7) encompassing the magnet system (5) with the atmosphere outside of the vacuum chamber (18), b) the cooling agent channel is implemented as a conduit (4) closed on its cross sectional periphery with at least one flat side (4a) in thermally conducting connection with the diaphragm (3), and that c) the diaphragm (3) and the surfaces of the conduit (4) facing away from the diaphragm (3) are exposed via said supporting structure (12) to the atmospheric pressure outside of the vacuum chamber (18).

8 Claims, 4 Drawing Sheets

U.S. PATENT DOCUMENTS

| | | | | |
|---|---|---|---|---|
| 5,071,535 A | * | 12/1991 | Hartig et al. ........... | 204/298.09 |
| 5,244,556 A | | 9/1993 | Inoue | |
| 5,269,894 A | * | 12/1993 | Kerschbaumer ........ | 204/192.12 |
| 5,421,978 A | * | 6/1995 | Schuhmacher et al. . | 204/298.09 |
| 6,146,509 A | * | 11/2000 | Aragon .................. | 204/298.19 |
| 6,328,856 B1 | | 12/2001 | Brucker | |
| 6,494,999 B1 | * | 12/2002 | Herrera et al. ......... | 204/298.12 |
| 6,689,254 B1 | * | 2/2004 | Hurwitt ................ | 204/298.12 |

FOREIGN PATENT DOCUMENTS

| | | |
|---|---|---|
| EP | 0 476 652 A1 | 3/1992 |
| JP | 59215485 A * | 12/1984 |
| JP | 8321497 | 12/1996 |
| JP | 11-323542 | 11/1999 |

OTHER PUBLICATIONS

Japanese Office Action in Japanese Patent Application No. 2004-378098, dated Jun. 26, 2008.

* cited by examiner

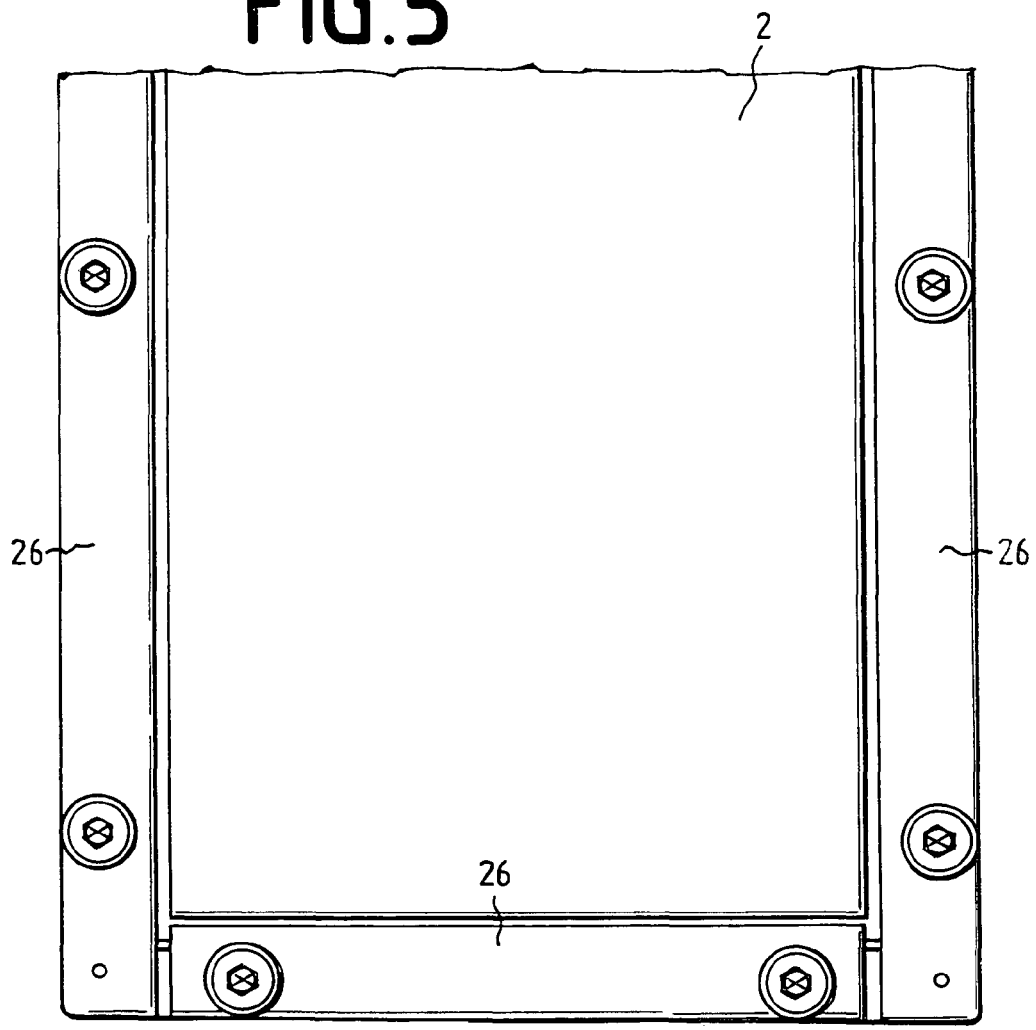
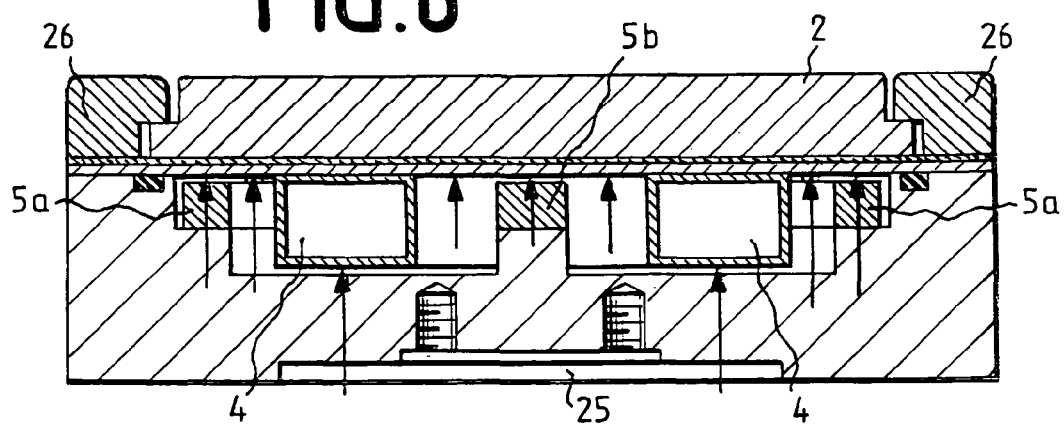

SPUTTERING CATHODE FOR COATING PROCESSES

This application claims priority from European Patent Application 04 014 534.4 filed Jun. 22, 2004, hereby incorporated by reference in its entirety.

FIELD OF THE INVENTION

The invention relates to a sputtering cathode for coating processes in a vacuum chamber, with an at least single-piece target plate mounted on a metallic diaphragm, on the side of which, facing away from the target, are disposed a cooling agent channel with an inflow line and an outflow line for a cooling agent and a hollow space for at least one magnet system, the magnet system being disposed in a supporting tub, sealed against the diaphragm, and not exposed to the cooling fluid, and the entire configuration being disposed on a supporting structure.

BACKGROUND AND SUMMARY OF THE INVENTION

Such sputtering cathodes are high-power sputtering cathodes and are also referred to as magnetron cathodes. Behind the target plate is disposed a magnet system, which generates on the opposing sputtering surface a closed magnetic tunnel in which the plasma of an ionized gas required for the sputtering process is enclosed. Thereby, on the one hand, the sputter rate is increased by the twenty to thirty-fold value compared to a magnet-free cathode, but, on the other hand, the energy density is focused onto a region beneath the magnetic tunnel and, consequently, also the erosion rate of the material of the target plate and the heat delivery into it. This forces a short-term change-out cycle of the target plate and an extremely efficient cooling system. The problems increase with the size of the sputtering cathode.

EP 0 476 652 B1 discloses closing off circular, relatively small cathode housings, in which are disposed magnet systems, with respect to the vacuum coating chamber through a relatively thick cathode plate (6 to 7 mm). Through this cathode plate and an encircling toroidal sealing ring the cathode housing, in which is disposed a cooling fluid flushing around the magnets, is closed off against the coating chamber. The patent expressly states that the penetration of the cooling fluid into the coating chamber leads to product rejects, since thereby the coating atmosphere—either inert gas or reactive gas—is spoiled. As the cooling fluid are specified for example water and ethylene glycol. The cathode plate can be implemented either homogeneously or laminated and be comprised of a base plate of aluminum, the target proper and a reinforcement layer of copper, optionally supplemented by a heating layer for outgassing the cathode before the coating. The stated cathode diameters reach up to 290 mm. However, a significant disadvantage is comprised in that in order to change the cathode plate, it is necessary to remove the cooling fluid, detach and clean the seal, before, after considerable loss of time, the system can again be taken into operation in the reverse direction.

The same document also discloses a base plate, in which, close behind the target material to be sputtered, closed cooling agent channels are disposed. However, here the hazard exists that if monitoring is neglected, the target material is etched through and the base plate is etched up to the cooling agent channels. This, in turn, entails the hazard of the cooling agent penetrating into the coating chamber. Means for establishing a connection of the cooling agent channels with the environment are not disclosed.

From DE 43 01 516 A1 is known a sputtering cathode of the above described species, in which a cooling agent channel is formed between an elastic diaphragm and a solid tub with an encircling hollow space and two encircling seals. Over the entire face of the diaphragm are disposed targets or target parts. The cooling agent channel and the target(s) are secured in place with alternatingly disposed screw connections from below and above, which, on the one hand, act via claws or nuts on the diaphragm with the tub and, on the other hand, onto the target margins. The magnets are here disposed outside of the cooling agent. However, since the entire sputtering cathode is disposed within a vacuum chamber (not shown), possibly leaking cooling agent could enter the vacuum chamber and negatively affect the coating process.

From DE 196 22 605 A1 and DE 196 22 606 C2 is known to dispose between the magnet system and the target plate at least one sheet metal blank of a magnetically conductive material in order to force onto the field lines, forming a magnetic tunnel for the plasma effecting the sputtering, a flatter course in order to widen the erosion trough in the target plate and to increase the [rate] efficiency of the material. In addition, DE 196 22 606 C2 also discloses a target base plate supporting the target.

The invention therefore addresses the problem of improving in a sputtering cathode of the species described in the introduction the heat transfer from target to cooling agent in simple, efficient, and cost-effective manner and to avoid the hazard of the cooling agent or its vapors penetrating into the vacuum chamber and of the impairment of the coating process.

The formulated problem is solved in a sputtering cathode of the species described in the introduction according to the invention thereby that a) the supporting structure for the sputtering cathode comprises a hollow body, which is closed gas-tight against the interior space of the vacuum chamber and which connects the hollow space encompassing the magnet system with the atmosphere outside of the vacuum chamber, b) the cooling agent channel is implemented as a conduit closed on its cross section periphery with at least one flat side, which [flat side] is in a thermally conducting connection with the diaphragm, and that c) the diaphragm and the surfaces of the conduit facing away from the diaphragm, via said supporting structure are exposed to the atmospheric pressure obtaining outside the vacuum chamber.

Through the invention, in a sputtering cathode of the species described in the introduction, the heat transfer from target to cooling agent in simple, efficient and cost-effective manner is improved and the hazard of the cooling agent or its vapors penetrating into the vacuum chamber and the impairment of the coating process are avoided.

In the course of further embodiments of the invention it is especially advantageous if, either individually or in combination the conduit for the cooling fluid has a rectangular cross section, whose one long side forms with the diaphragm a heat conducting connection, the conduit for the cooling fluid is connected with the diaphragm through joining process, the hollow body of the supporting structure is fastened on a mounting plate which is fastened on a wall of the vacuum chamber, which, within the connection site of the mounting plate, has an opening with respect to the ambient atmosphere, at both ends of the conduit orthogonal tubular fittings are connected terminating in elbows, and from which connection lines are guided through the hollow body of the supporting structure up to the ambient atmosphere, the supporting tub of the sputtering cathode via a support body closed on the periphery vacuum-tight is connected with the hollow body of the supporting structure, the supporting tub of the sputtering cathode and the mountings for the target plate(s) are encompassed by a housing, which extends by means of a first frame over the mountings of the target plate(s) and by means of a second frame extends under the supporting tub up into the proximity of the support body and/or if the conduit extends within the sputtering cathode approximately entrally between the different poles of the magnet system.

In the following an embodiment example of the subject matter of the invention and its operational function and advantages will be explained in further detail in conjunction with a rectangular cathode according to FIGS. 1 to 6.

DETAILED DESCRIPTION

It should be emphasized at the outset that the sputtering cathode is shown as a rectangular cathode whose length for large-area coating by means of a relative longitudinal movement of glass can be several meters, however, that the structural principle can readily be employed for round cathodes of any size. It is understood that the application is also possible in the converse, i.e. in "over-head position" or also in any oblique positions, for example in the case of foil coating on cylinders.

Figure 1:
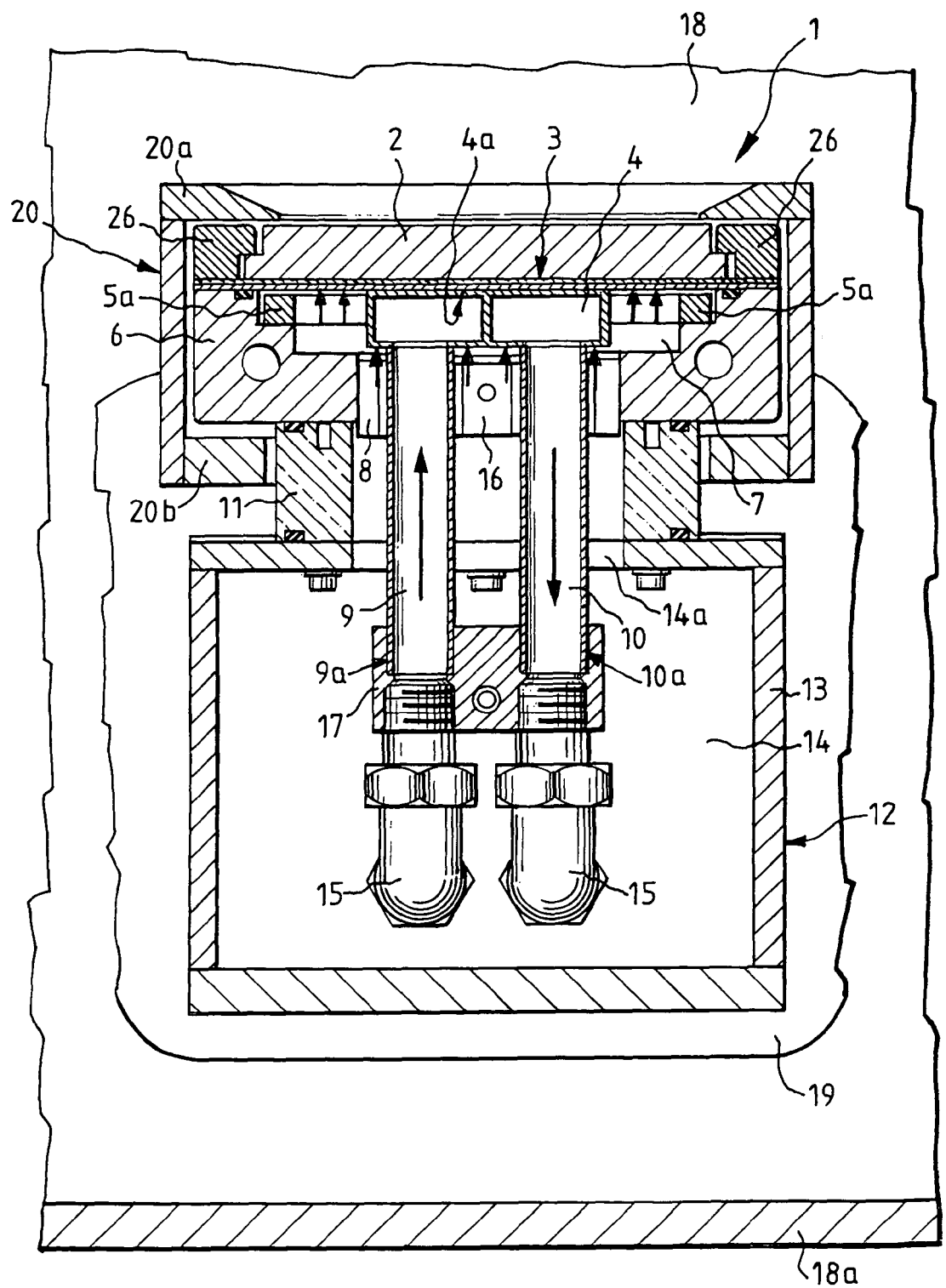
FIG. 1 a vertical section through a complete cathode system with supporting structure within a cut-out of a vacuum chamber with a cutting plane perpendicular to the longitudinal axis of the cathode, FIG. 2 a partial vertical longitudinal section through that end of the cathode system at which the conduit for the cooling agent supply is connected, however without supporting structure and at an enlarged scale, FIG. 3 the other end of the cathode system relative to FIG. 2, at which the conduit is turned around by 180 degrees, FIG. 4 a top view onto the magnet system after removal of the target plate, at a reduced scale, FIG. 5 a top view onto one end of the cathode system, and FIG. 6 an orthogonal cross section through the cathode system according to FIGS. 2, 3 and 5.

FIG. 1 depicts a sputtering cathode 1, whose functionally essential part is a target plate 2, which during operation supplies the coating material or a component thereof, depending on whether the method is carried out in an inert (for example argon) or a reactive atmosphere (for example oxygen or nitrogen). The target plate 2 can be structured monolithically or be comprised of layers, which is known per se.

Behind the target plate 2 is first disposed an elastic diaphragm 3 of metal, which also can be structured of a single layer or of multiple layers. One of the layers 3a can be comprised, for example, of iron, steel and/or high-grade steel and the other layer 3b of copper. The layer 3a serves for the purpose of flattening the arcuate course of the field lines, which enclose a magnetic tunnel, in order to widen the erosion troughs in the target plate and to increase the material [rate] efficiency. In heat-conducting connection with layer 3b is an approximately U-shaped cooling agent channel of a conduit 4, whose cross section is rectangular and whose upper flat side 4a is connected with the target plate 2, such that the connection conducts heat well. This connection is preferably established through a joining method from the group soldering, welding or adhering with a thermally conducting adhesive agent. Spaced behind it is disposed a magnet system 5 (FIG. 4), of which here only the outer magnet row 5a is shown. Layers 3a and 3b have a total thickness of 2 to 4 mm, but are preferably not fixedly connected with one another in order to keep the elasticity through relative displaceability as large as possible.

Diaphragm 3 and magnet system 5 are held by a supporting tub 6, which comprises a correspondingly shaped step-form hollow space 7 and a through-opening 8 for an inflow line 9 and an outflow line 10 for a cooling fluid. The entire configuration is mounted via a peripherally closed support body 11 on a supporting structure 12, which comprises a hollow body 13 and encompasses a cuboidal hollow space 14 with an upper opening 14a. This hollow space 14 is connected with the external atmosphere in a manner to be described further in the following. The short thick arrows directed against the diaphragm 3 and the conduit 4 symbolize the contact forces through the outer atmospheric pressure, which penetrates up to the hollow space 7 of the supporting tub 6.

Lines 9 and 10 are implemented as tubular fittings 9a and 10a and terminate in elbows 15, to which additional lines are connected, not shown here, which are guided in the longitudinal direction through the hollow space 14 to the outside atmosphere. To maintain the distance between the tubular fittings 9a and 10a serve clamping devices 16 and 17. The seals for the vacuum-tight closure between the coating and the external atmosphere are indicated by black rectangles and are not labeled with a reference number.

The configuration described up to this point is disposed in a vacuum chamber 18, of which here only a cut-out and the bottom 18a are depicted. For this purpose the hollow body 13 of the supporting structure 12 is fastened on a mounting plate 19, which is fastened vacuum-tight on a wall of the vacuum chamber 18. Said wall includes within the mounting plate 19 or the connection site an opening, not shown here, with respect to the ambient or external atmosphere.

Shown is further that the sputtering cathode 1 with its supporting tub 6 is encompassed by a housing 20, which extends by means of a first upper frame 20a over the mountings and margins of the target plate 2 and, by means of a second lower frame 20b, extends beneath the supporting tub 6 up into the proximity of the support body 11.

Figure 2:
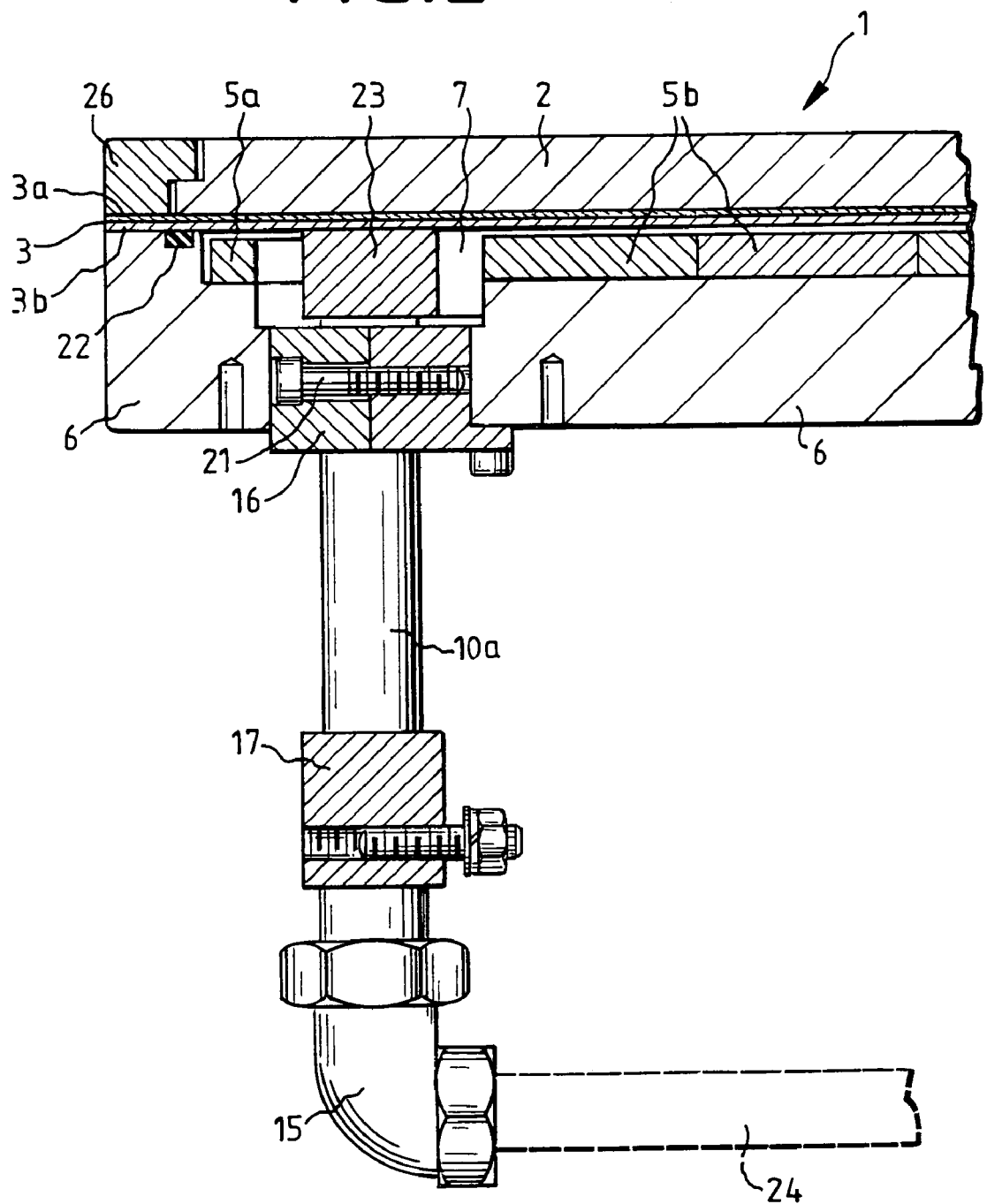

FIG. 2 to 6 show under maintenance of the previuos enumeratin the following:

FIG. 2 shows a partial vertical longitudinal section through that end of the cathode system, at which the tubular fittings 9a and 10a for the cooling agent supply to the conduit 4 are connected, however, without supporting structure 12. The longitudinal section extends through the central magnet row 5b, previously not shown, a tension bolt 21 through the clamping device 16 and a partial circumference of one of the seals 22, a partition wall 23 between the connection-side ends of the conduit 4 and—in dashed lines—one of the horizontal connection lines 24 carried to the external atmosphere.

Figure 3:
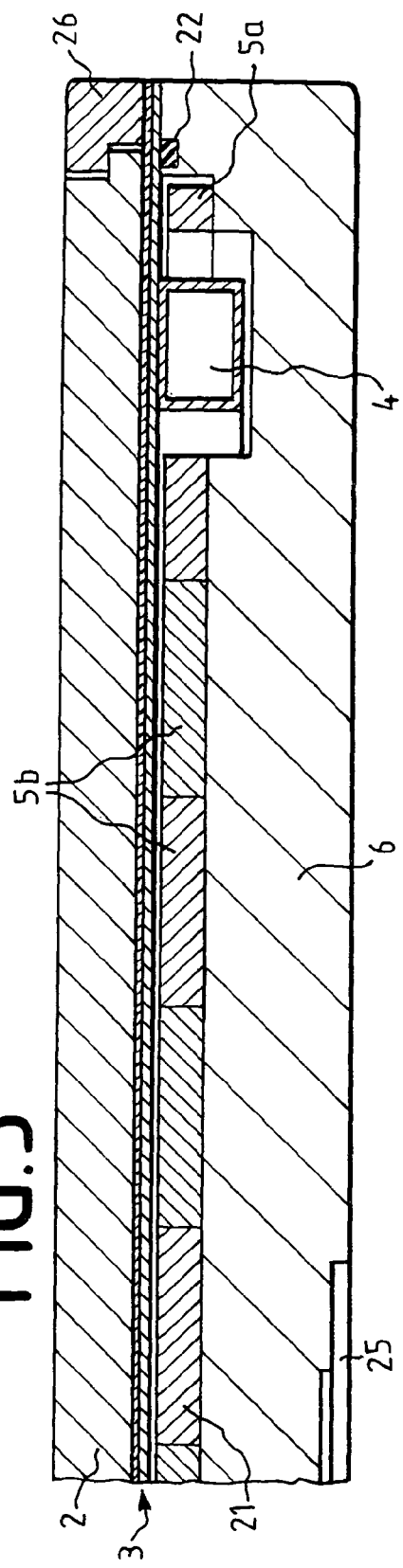

FIG. 3 shows the other end of the cathode system with respect to FIG. 2, at which the conduit 4 is turned around by 180 degrees. A step-form recess 25 serves for receiving a, not shown, supporting device with respect to the supporting structure 12.

Figure 4:
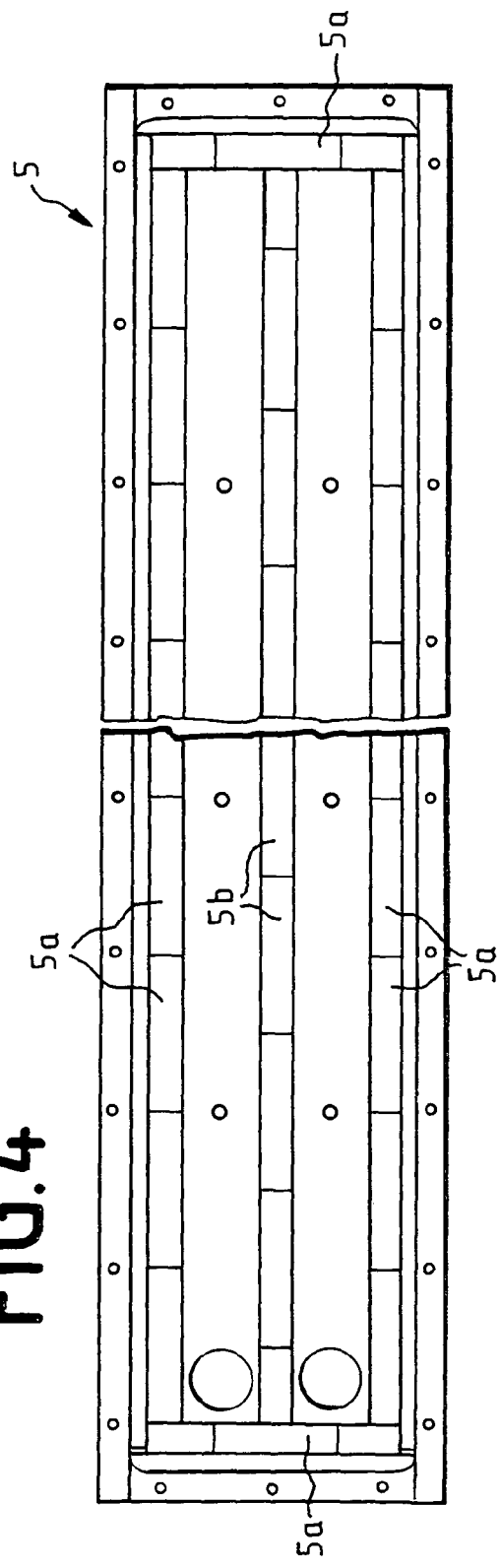

FIG. 4 is a top view onto the magnet system 5, respectively 5a and 5b, after the target plate 2 has been removed. This magnet system generates a magnetic field penetrating through the target plate 2 with arcuate field lines and with a race track-like configuration, which encloses a congruous plasma formed through a potential difference between the sputtering cathode 1 and a, not shown, anode, which [plasma] is excited through an anode body and/or through a, also not shown, substrate holder at ground potential. Said plasma under high energy charging sputters the material of the target plate 2 and ensures a condensation of the sputtered-off material or a compound thereof on the substrates. However, such causal relationships which necessitate efficient cooling are known and therefore not further discussed.

FIG. 5 is a top view onto one end of the cathode system. The target plate 2 is secured due to a Z-shaped implementation of the partition lines through a frame of claw cleats bolted to the supporting tub 6, which also clamp in the diaphragm 3 against the supporting tub 6.

FIG. 6 depicts at an enlarged scale, compared to FIG. 1, an orthogonal cross section through the cathode system according to FIGS. 2, 3 and 5. Shown again through thick black arrows are the force effects of the external atmospheric pressure on the diaphragm 3 and the conduit 4. The outer magnet rows 5a are disposed mirror symmetrical to the inner magnet row 5b. In the interspace 7 the two shanks of the conduit 4 are disposed spaced apart from the outer magnet rows 5a and to the central magnet row 5b. This permits an extremely efficient cooling of diaphragm 3 and target plate 2 and to maintain them at constant temperature after heating. It is additionally emphasized that between the upper delimiting surfaces of the magnet rows 5a and 5b, spacings or air gaps are also formed.

It is claimed:

1. A rectangular sputtering cathode system comprising a magnet system and a target plate being configured to supply coating material during operation and being for coating processes in a vacuum chamber in which the target plate, which is an at least single-piece target plate, is mounted on an elastic metallic diaphragm on whose side facing away from the target plate there is located a conduit with an inflow line and an outflow line for a cooling agent and a hollow space for the magnet system, the magnet system being disposed in a supporting tub sealed against the diaphragm and not contacted by the cooling agent and the entire configuration being disposed on a supporting structure, wherein the supporting structure for the sputtering cathode comprises a hollow body which is closed gas-tight against the interior space of the vacuum chamber and which connects the hollow space encompassing the magnet system with the outside of the vacuum chamber, the cooling agent channel is a conduit closed on its cross sectional periphery and has at least one flat side in thermally conducting connection with the diaphragm, a further hollow space of the hollow body is connected with the external atmospheric pressure, the further hollow space being connected with the hollow space for the magnet system such that the surface of the diaphragm facing the hollow space and the surfaces of the conduit facing away from the diaphragm are each directly exposed via the hollow body of said supporting structure and the hollow space to atmospheric pressure outside of the vacuum chamber.

2. The sputtering cathode as claimed in claim 1, wherein the conduit for the cooling agent has a rectangular cross section, whose one long side is in thermally conducting connection with the diaphragm.

3. The sputtering cathode as claimed in claim 1, wherein the conduit for the cooling agent is connected with the diaphragm through a joining process.

4. The sputtering cathode as claimed in claim 1, wherein the hollow body of the supporting structure is fastened on a mounting plate, which is fastened on a wall of the vacuum chamber, which, within a connection site of the mounting plate, has an opening with respect to the ambient atmosphere.

5. The sputtering cathode as claimed in claim 4, wherein at both ends of the conduit orthogonal tubular fittings are connected terminating in elbows and from which connecting lines are carried through the hollow body of the supporting structure to the ambient atmosphere.

6. The sputtering cathode as claimed in claim 1, wherein the supporting tub of the sputtering cathode is connected vacuum-tight with the hollow body of the supporting structure via a support body closed on the circumference.

7. The sputtering cathode as claimed in claim 6, wherein the supporting tub of the sputtering cathode and a mounting for target plate is encompassed by a housing which by means of a first frame, extends over the mounting of the target plate and, by a second frame, extends under the supporting tub up into the proximity of the support body.

8. The sputtering cathode as claimed in claim 1, wherein the conduit extends within the sputtering cathode approximately centrally between the different poles of the magnet system.

* * * * *